(12) United States Patent
Yue et al.

(10) Patent No.: US 7,713,760 B2
(45) Date of Patent: May 11, 2010

(54) PROCESS SYSTEM HEALTH INDEX AND METHOD OF USING THE SAME

(75) Inventors: Hongyu Yue, Austin, TX (US); Hieu A. Lam, Richardson, TX (US)

(73) Assignee: Tokyo Electron Limited, Tokyo (JP)

( * ) Notice: Subject to any disclaimer, the term of this patent is extended or adjusted under 35 U.S.C. 154(b) by 1545 days.

(21) Appl. No.: 10/809,437

(22) Filed: Mar. 26, 2004

(65) Prior Publication Data
US 2004/0259276 A1 Dec. 23, 2004

Related U.S. Application Data

(60) Provisional application No. 60/470,901, filed on May 16, 2003.

(51) Int. Cl.
*H01L 21/00* (2006.01)
(52) U.S. Cl. .................. 438/14; 257/E21.525
(58) Field of Classification Search .................. 438/14; 257/E21.525
See application file for complete search history.

(56) References Cited

U.S. PATENT DOCUMENTS

| | | | |
|---|---|---|---|
| 5,442,562 A | 8/1995 | Hopkins et al. | |
| 5,658,423 A * | 8/1997 | Angell et al. .................. | 438/9 |
| 5,825,482 A | 10/1998 | Nikoonahad et al. | |
| 6,153,115 A * | 11/2000 | Le et al. .................. | 216/60 |
| 6,353,802 B1 * | 3/2002 | Barbur et al. .................. | 702/84 |
| 6,368,883 B1 | 4/2002 | Bode et al. | |
| 6,369,754 B1 * | 4/2002 | Levanon .................. | 342/357.16 |
| 6,405,096 B1 | 6/2002 | Toprac et al. | |
| 6,442,496 B1 | 8/2002 | Pasadyn et al. | |
| 6,564,119 B1 * | 5/2003 | Vaculik et al. .................. | 700/146 |
| 6,789,052 B1 * | 9/2004 | Toprac .................. | 703/2 |
| 6,804,563 B1 * | 10/2004 | Lafaye de Micheaux .................. | 700/51 |
| 6,853,920 B2 * | 2/2005 | Hsiung et al. .................. | 702/1 |
| 6,896,763 B2 * | 5/2005 | Balasubramhanya et al. .................. | 156/345.24 |
| 6,985,779 B2 * | 1/2006 | Hsiung et al. .................. | 700/19 |
| 7,523,384 B2 * | 4/2009 | Wold .................. | 714/799 |
| 2002/0067493 A1 * | 6/2002 | Odagiri et al. .................. | 358/1.9 |
| 2005/0125090 A1 * | 6/2005 | Sakano et al. .................. | 700/108 |

FOREIGN PATENT DOCUMENTS

| | | |
|---|---|---|
| JP | 61-253573 | 11/1986 |
| JP | 7-200040 | 8/1995 |
| JP | 2003-68717 | 3/2003 |
| WO | WO 00/33218 | 6/2000 |
| WO | WO 02/077589 A2 | 10/2002 |
| WO | WO 02/086478 A2 | 10/2002 |

\* cited by examiner

*Primary Examiner*—Kiesha R Bryant
*Assistant Examiner*—Igwe U Anya
(74) *Attorney, Agent, or Firm*—Oblon, Spivak, McClelland, Maier & Neustadt, L.L.P.

(57) ABSTRACT

A method of monitoring a processing system for processing a substrate during the course of semiconductor manufacturing is described. The method comprises acquiring data from the processing system for a plurality of observations. It further comprises constructing a principal components analysis (PCA) model from the data, wherein a weighting factor is applied to at least one of the data variables in the acquired data. The PCA mode is utilized in conjunction with the acquisition of additional data, and at least one statistical quantity is determined for each additional observation. Upon setting a control limit for the processing system, the at least one statistical quantity is compared with the control limit for each additional observation. When, for example, the at least one statistical quantity exceeds the control limit, a fault for the processing system is detected.

11 Claims, 9 Drawing Sheets

PROCESS SYSTEM HEALTH INDEX AND METHOD OF USING THE SAME

CROSS REFERENCE TO RELATED APPLICATIONS

This application claims priority to and is related to U.S. Provisional Application Ser. No. 60/470,901, filed on May 16, 2003. The contents of which is incorporated herein by reference.

FIELD OF THE INVENTION

The present invention relates to a process system health index and method of using the same, and more particularly to a process system health index utilizing a weighted principal component analysis (WPCA).

BACKGROUND OF THE INVENTION

Throughout the various stages of plasma processing, such as semiconductor or display manufacturing, etc., critical process parameters may vary significantly. Processing conditions change over time with the slightest changes in critical process parameters creating undesirable results. Small changes can easily occur in the composition or pressure of an etch gas, process chamber, or wafer temperature. As such, plasma processing facilities require constant monitoring.

The measuring and monitoring of these process parameters at any given time permits valuable data to be accumulated and analyzed. Process control feedback may be used to adjust the process parameters or determine the viability of certain process materials. However, in many cases, changes of process data reflecting deterioration of processing characteristics cannot be detected by simply referring to the process data displayed. It is difficult to detect early stage abnormalities and characteristic deterioration of a process, and often may be necessary to obtain fault detection and prediction, as well as pattern recognition by an advanced process control (APC).

SUMMARY OF THE INVENTION

A method and system of monitoring a processing system for processing a substrate during the course of semiconductor manufacturing comprising the steps of and system for: acquiring data from the processing system for a plurality of observations, the data comprising a plurality of data variables; determining one or more principal components of the data for the plurality of observations using principal components analysis; weighting at least one of the plurality of data variables during the principal components analysis; acquiring additional data from the processing system; determining at least one statistical quantity from one or more scores calculated from a projection of the additional data onto the one or more principal components; determining a control limit for the at least one statistical quantity; and comparing the at least one statistical quantity to the control limit.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
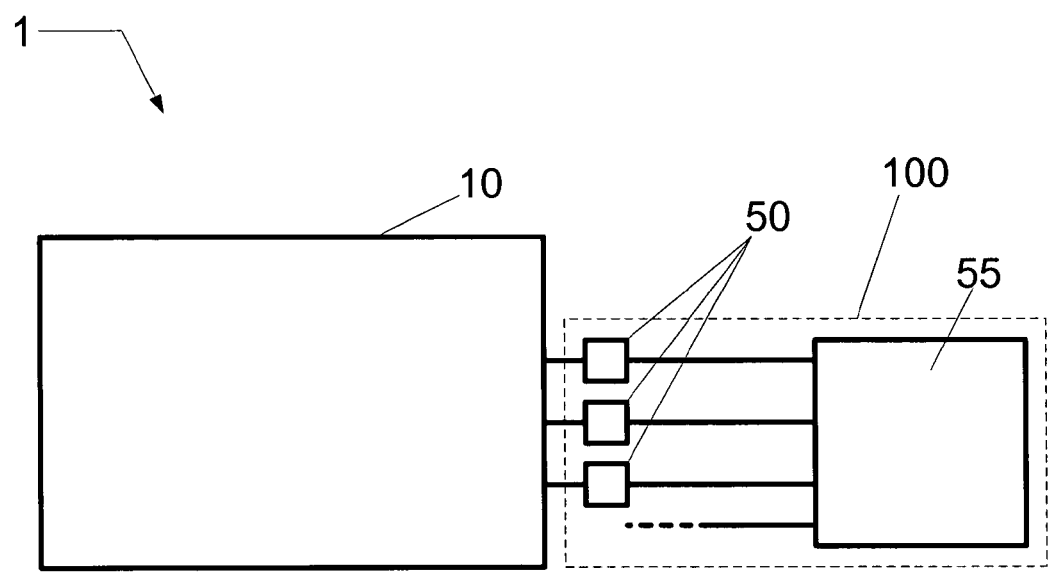
FIG. 1 shows a material processing system according to a preferred embodiment of the present invention.

According to an embodiment of the present invention, a material processing system 1 is depicted in FIG. 1 that includes a process tool 10 and a process performance monitoring system 100. The process performance monitoring system 100 includes a plurality of sensors 50 and a controller 55. Alternately, the material processing system 1 can include a plurality of process tools 10. The sensors 50 are coupled to the process tool 10 to measure tool data and the controller 55 is coupled to the sensors 50 in order to receive tool data. Alternately, the controller 55 is further coupled to process tool 10. Moreover, the controller 55 is configured to monitor process performance data for the process tool using the tool data. The process performance data can, for example, include the detection of process faults.

In the illustrated embodiment depicted in FIG. 1, the material processing system 1 utilizes a plasma for material processing. Desirably, the material processing system 1 includes an etch chamber. Alternately, the material processing system 1 includes a photoresist coating chamber such as, for example, a photoresist spin coating system; a photoresist patterning chamber such as, for example, an ultraviolet (UV) lithography system; a dielectric coating chamber such as, for example, a spin-on-glass (SOG) or spin-on-dielectric (SOD) system; a deposition chamber such as, for example, a chemical vapor deposition (CVD) system or a physical vapor deposition (PVD) system; a rapid thermal processing (RTP) chamber such as, for example, a RTP system for thermal annealing; or a batch-processing vertical furnace.

Figure 2:
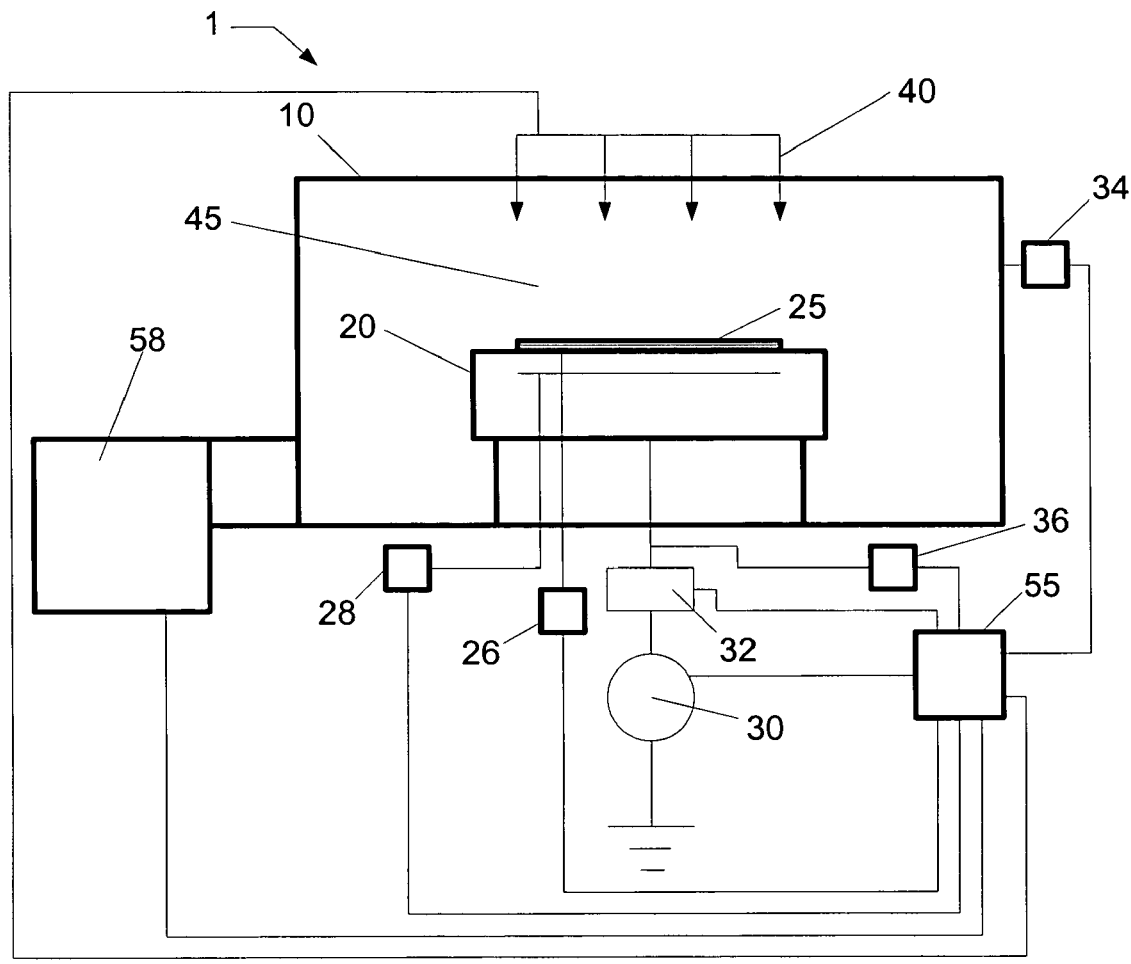
FIG. 2 shows a material processing system according to one embodiment of the present invention.

According to the illustrated embodiment of the present invention depicted in FIG. 2, the material processing system 1 includes process tool 10, substrate holder 20, upon which a substrate 25 to be processed is affixed, gas injection system 40, and vacuum pumping system 58. Substrate 25 can be, for example, a semiconductor substrate, a wafer, or a liquid crystal display (LCD). Process tool 10 can be, for example, configured to facilitate the generation of plasma in processing region 45 adjacent a surface of substrate 25, where plasma is formed via collisions between heated electrons and an ionizable gas. An ionizable gas or mixture of gases is introduced via gas injection system 40, and the process pressure is adjusted. Desirably, plasma is utilized to create materials specific to a predetermined materials process, and to aid either the deposition of material to substrate 25 or the removal of material from the exposed surfaces of substrate 25. For example, controller 55 can be used to control vacuum pumping system 58 and gas injection system 40.

Substrate 25 can be, for example, transferred into and out of process tool 10 through a slot valve (not shown) and chamber feed-through (not shown) via robotic substrate transfer system where it is received by substrate lift pins (not shown) housed within substrate holder 20 and mechanically translated by devices housed therein. Once substrate 25 is received from substrate transfer system, it is lowered to an upper surface of substrate holder 20.

For example, substrate 25 can be affixed to the substrate holder 20 via an electrostatic clamping system 28. Furthermore, substrate holder 20 can further include a cooling system including a re-circulating coolant flow that receives heat from substrate holder 20 and transfers heat to a heat exchanger system (not shown), or when heating, transfers heat from the heat exchanger system. Moreover, gas can be delivered to the back-side of the substrate via a backside gas system 26 to improve the gas-gap thermal conductance between substrate 25 and substrate holder 20. Such a system can be utilized when temperature control of the substrate is required at elevated or reduced temperatures. For example, temperature control of the substrate can be useful at temperatures in excess of the steady-state temperature achieved due to a balance of the heat flux delivered to the substrate 25 from the plasma and the heat flux removed from substrate 25 by conduction to the substrate holder 20. In other embodiments, heating elements, such as resistive heating elements, or thermoelectric heaters/coolers can be included.

As shown in FIG. 2, substrate holder 20 includes an electrode through which RF power is coupled to plasma in processing region 45. For example, substrate holder 20 can be electrically biased at an RF voltage via the transmission of RF power from RF generator 30 through impedance match network 32 to substrate holder 20. The RF bias can serve to heat electrons to form and maintain plasma. In this configuration, the system can operate as a reactive ion etch (RIE) reactor, where the chamber and upper gas injection electrode serve as ground surfaces. A typical frequency for the RF bias can range from 1 MHz to 100 MHz and is preferably 13.56 MHz.

Alternately, RF power can be applied to the substrate holder electrode at multiple frequencies. Furthermore, impedance match network 32 serves to maximize the transfer of RF power to plasma in processing chamber 10 by minimizing the reflected power. Various match network topologies (e.g., L-type, π-type, T-type, etc.) and automatic control methods can be utilized.

With continuing reference to FIG. 2, process gas can be, for example, introduced to processing region 45 through gas injection system 40. Process gas can, for example, include a mixture of gases such as argon, $CF_4$ and $O_2$, or argon, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$. Gas injection system 40 includes a showerhead, where process gas is supplied from a gas delivery system (not shown) to the processing region 45 through a gas injection plenum (not shown), a series of baffle plates (not shown) and a multi-orifice showerhead gas injection plate (not shown).

Vacuum pump system 58 can, for example, include a turbomolecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mtorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) is coupled to the process chamber 16. The pressure measuring device can be, for example, a Type 628B Baratron absolute capacitance manometer commercially available from MKS Instruments, Inc. (Andover, Mass.).

As depicted in FIG. 1, process performance monitoring system 100 includes plurality of sensors 50 coupled to process tool 10 to measure tool data and controller 55 coupled to the sensors 50 to receive tool data. The sensors 50 can include both sensors that are intrinsic to the process tool 10 and sensors extrinsic to the process tool 10. Sensors intrinsic to process tool 10 can include those sensors pertaining to the functionality of process tool 10 such as the measurement of the Helium backside gas pressure, Helium backside flow, electrostatic clamping (ESC) voltage, ESC current, substrate holder 20 temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, capacitor settings (i.e., $C_1$ and $C_2$ positions), a focus ring thickness, RF hours, focus ring RF hours, and any statistic thereof. Alternatively, sensors extrinsic to process tool 10 can include those not directly related to the functionality of process tool 10 such as a light detection device 34 for monitoring the light emitted from the plasma in processing region 45 as shown in FIG. 2, or an electrical measurement device 36 for monitoring the electrical system of process tool 10 as shown in FIG. 2.

The light detection device 34 can include a detector such as a (silicon) photodiode or a photomultiplier tube (PMT) for measuring the total light intensity emitted from the plasma. The light detection device 34 can further include an optical filter such as a narrow-band interference filter. In an alternate embodiment, the light detection device 34 includes a line CCD (charge coupled device) or CID (charge injection device) array and a light dispersing device such as a grating or a prism. Additionally, light detection device 34 can include a monochromator (e.g., grating/detector system) for measuring light at a given wavelength, or a spectrometer (e.g., with a rotating grating) for measuring the light spectrum such as, for example, the device described in U.S. Pat. No. 5,888,337.

The light detection device 34 can include a high resolution OES sensor from Peak Sensor Systems. Such an OES sensor has a broad spectrum that spans the ultraviolet (UV), visible (VIS) and near infrared (NIR) light spectrums. The resolution is approximately 1.4 Angstroms, that is, the sensor is capable of collecting 5550 wavelengths from 240 to 1000 nm. The sensor is equipped with high sensitivity miniature fiber optic UV-VIS-NIR spectrometers which are, in turn, integrated with 2048 pixel linear CCD arrays.

The spectrometers receive light transmitted through single and bundled optical fibers, where the light output from the optical fibers is dispersed across the line CCD array using a fixed grating. Similar to the configuration described above, light emitting through an optical vacuum window is focused onto the input end of the optical fibers via a convex spherical lens. Three spectrometers, each specifically tuned for a given spectral range (UV, VIS and NIR), form a sensor for a process chamber. Each spectrometer includes an independent A/D converter. And lastly, depending upon the sensor utilization, a full emission spectrum can be recorded every 0.1 to 1.0 seconds.

The electrical measurement device 36 can include, for example, a current and/or voltage probe, a power meter, or spectrum analyzer. For example, plasma processing systems often employ RF power to form plasma, in which case, an RF transmission line, such as a coaxial cable or structure, is employed to couple RF energy to the plasma through an electrical coupling element (i.e., inductive coil, electrode, etc.). Electrical measurements using, for example, a current-voltage probe, can be exercised anywhere within the electrical (RF) circuit, such as within an RF transmission line. Furthermore, the measurement of an electrical signal, such as a time trace of voltage or current, permits the transformation of the signal into frequency space using discrete Fourier series representation (assuming a periodic signal). Thereafter, the Fourier spectrum (or for a time varying signal, the frequency spectrum) can be monitored and analyzed to characterize the state of material processing system 1. A voltage-current probe can be, for example, a device as described in detail in pending U.S. Application Ser. No. 60/259,862 filed on Jan. 8, 2001, and U.S. Pat. No. 5,467,013, each of which is incorporated herein by reference in its entirety.

In alternate embodiments, electrical measurement device 36 can include a broadband RF antenna useful for measuring a radiated RF field external to material processing system 1. A commercially available broadband RF antenna is a broadband antenna such as Antenna Research Model RAM-220 (0.1 MHz to 300 MHz).

In general, the plurality of sensors 50 can include any number of sensors, intrinsic and extrinsic, which can be coupled to process tool 10 to provide tool data to the controller 55.

Controller 55 includes a microprocessor, memory, and a digital I/O port (potentially including D/A and/or A/D converters) capable of generating control voltages sufficient to communicate and activate inputs to material processing system 1 as well as monitor outputs from material processing system 1. As shown in FIG. 2, controller 55 can be coupled to and exchange information with RF generator 30, impedance match network 32, gas injection system 40, vacuum pump system 58, backside gas delivery system 26, electrostatic clamping system 28, light detection device 34, and electrical measurement device 36. A program stored in the memory is utilized to interact with the aforementioned components of a material processing system 1 according to a stored process recipe. One example of controller 55 is a DELL PRECISION WORKSTATION 530™, available from Dell Corporation, Austin, Tex. Controller 55 can be locally located relative to the material processing system 1, or it can be remotely located relative to the material processing system 1. For example, controller 55 can exchange data with material processing system 1 using at least one of a direct connection, an intranet, and the internet. Controller 55 can be coupled to an intranet at, for example, a customer site (i.e., a device maker, etc.), or it can be coupled to an intranet at, for example, a vendor site (i.e., an equipment manufacturer). Additionally, for example, controller 55 can be coupled to the internet. Furthermore, another computer (i.e., controller, server, etc.) can, for example, access controller 55 to exchange data via at least one of a direct connection, an intranet, and the internet.

Figure 3:
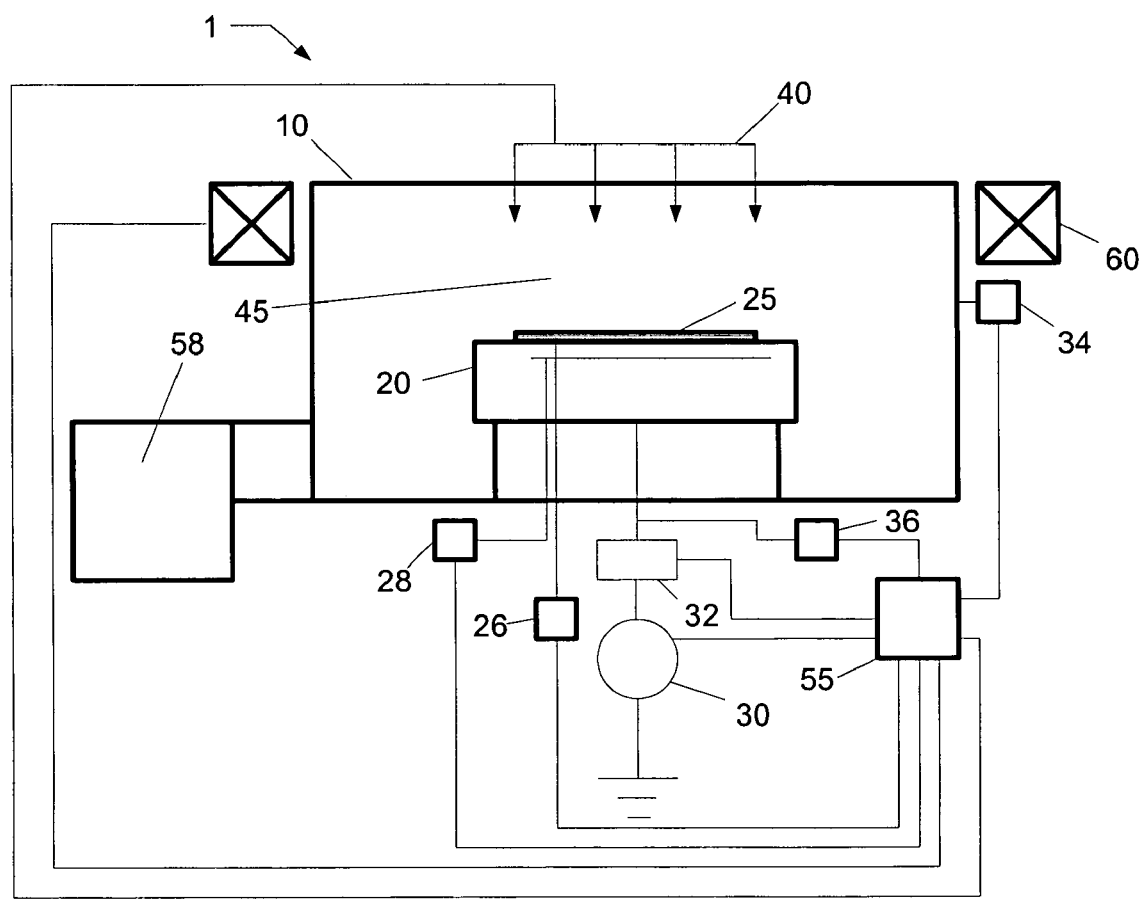
FIG. 3 shows a material processing system according to another embodiment of the present invention.

As shown in FIG. 3, material processing system 1 can include a magnetic field system 60. For example, the magnetic field system 60 can include a stationary, or either a mechanically or electrically rotating DC magnetic field in order to potentially increase plasma density and/or improve material processing uniformity. Moreover, controller 55 can be coupled to magnetic field system 60 in order to regulate the field strength or speed of rotation.

Figure 4:
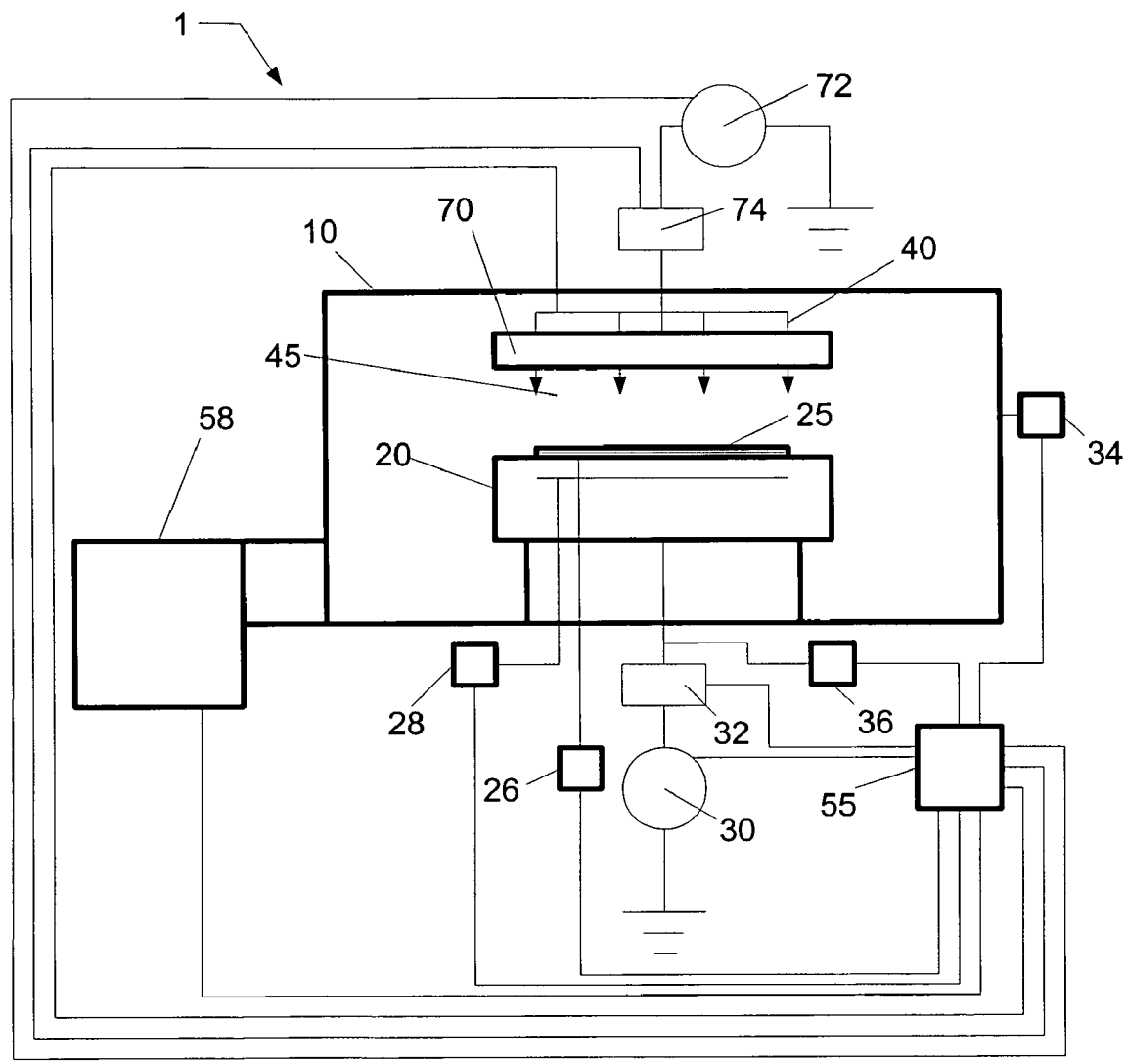
FIG. 4 shows a material processing system according to a further embodiment of the present invention.

As shown in FIG. 4, the material processing system can include an upper electrode 70. For example, RF power can be coupled from RF generator 72 through impedance match network 74 to upper electrode 70. A frequency for the application of RF power to the upper electrode preferably ranges from 10 MHz to 200 MHz and is preferably 60 MHz. Additionally, a frequency for the application of power to the lower electrode can range from 0.1 MHz to 30 MHz and is preferably 2 MHz. Moreover, controller 55 can be coupled to RF generator 72 and impedance match network 74 in order to control the application of RF power to upper electrode 70.

Figure 5:
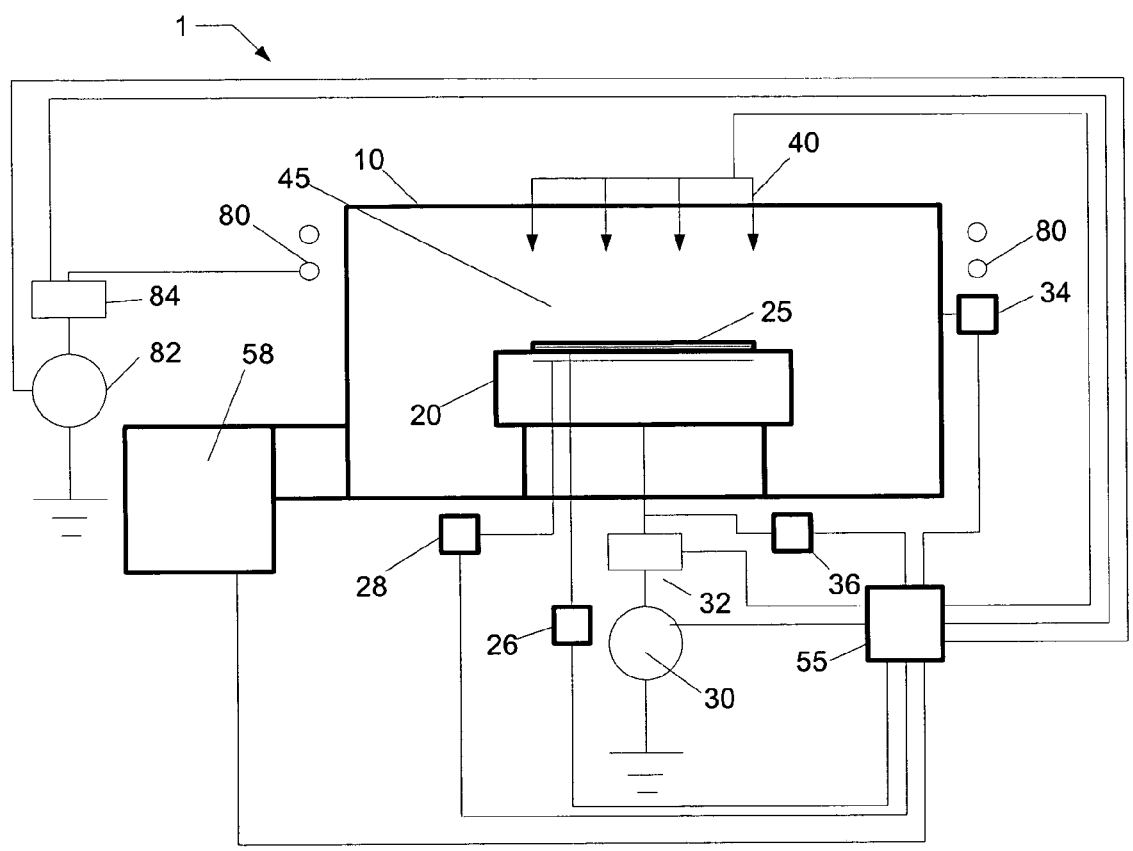
FIG. 5 shows a material processing system according to an additional embodiment of the present invention.

As shown in FIG. 5, the material processing system of FIG. 1 can include an inductive coil 80. For example, RF power can be coupled from RF generator 82 through impedance match network 84 to inductive coil 80, and RF power can be inductively coupled from inductive coil 80 through dielectric window (not shown) to plasma processing region 45. A frequency for the application of RF power to the inductive coil 80 preferably ranges from 10 MHz to 100 MHz and is preferably 13.56 MHz. Similarly, a frequency for the application of power to the chuck electrode preferably ranges from 0.1 MHz to 30 MHz and is preferably 13.56 MHz. In addition, a slotted Faraday shield (not shown) can be employed to reduce capacitive coupling between the inductive coil 80 and plasma. Moreover, controller 55 can be coupled to RF generator 82 and impedance match network 84 in order to control the application of power to inductive coil 80. In an alternate embodiment, inductive coil 80 can be a "spiral" coil or "pancake" coil in communication with the plasma processing region 45 from above as in a transformer coupled plasma (TCP) reactor.

Alternately, the plasma can be formed using electron cyclotron resonance (ECR). In yet another embodiment, the plasma is formed from the launching of a Helicon wave. In yet another embodiment, the plasma is formed from a propagating surface wave.

As discussed above, the process performance monitoring system 100 includes plurality of sensors 50 and controller 55, where the sensors 50 are coupled to process tool 10 and the controller 55 is coupled to the sensors 50 to receive tool data. The controller 55 is further capable of executing at least one algorithm to optimize the tool data received from the sensors 50, determine a relationship (model) between the tool data, and use the relationship (model) for fault detection.

When encountering large sets of data involving a substantive number of variables, multivariate analysis (MVA) is often applied. For example, one such MVA technique includes Principal Components Analysis (PCA). In PCA, a model can be assembled to extract from a large set of data, a signal exhibiting the greatest variance in the multi-dimensional variable space.

For example, each set of data for a given substrate run, or instant in time, can be stored as a row in a matrix $\overline{X}$ and, hence, once the matrix $\overline{X}$ is assembled, each row represents a different substrate run, or instant in time, and each column represents a different data signal (or data variable) corresponding to the plurality of sensors 50. Therefore, matrix $\overline{X}$ is a rectangular matrix of dimensions m by n. Once the data is stored in the matrix, the data is preferably mean-centered and/or normalized, if desired. The process of mean-centering the data stored in a matrix column involves computing a mean value of the column elements and subtracting the mean value from each element. Moreover, the data residing in a column of the matrix can be normalized by determining the standard deviation of the data in the column.

Using the PCA technique, the correlation structure within matrix $\overline{X}$ is determined by approximating matrix $\overline{X}$ with a matrix product $(\overline{TP^T})$ of lower dimensions plus an error matrix $\overline{E}$, viz.

$$\overline{X} = \overline{TP^T} + \overline{E}, \quad (1)$$

where $\overline{T}$ is a (m by p) matrix of scores that summarizes the $\overline{X}$-variables and $\overline{P}$ is a (n by p, where p≦n) matrix of loadings showing the influence of the variables.

In general, the loadings matrix $\overline{P}$ can be shown to comprise the eigenvectors of the covariance matrix of $\overline{X}$, where the covariance matrix $\overline{S}$ can be shown to be $$\overline{S} = \overline{X}^T \overline{X}. \quad (2)$$

The covariance matrix $\overline{S}$ is a real, symmetric matrix and, therefore, it can be described as $$\overline{S} = \overline{U}\overline{\Lambda}\overline{U}^T \quad (3)$$

where the real, symmetric eigenvector matrix $\overline{U}$ comprises the normalized eigenvectors as columns and $\overline{\Lambda}$ is a diagonal matrix comprising the eigenvalues corresponding to each eigenvector along the diagonal. Using equations (1) and (3) (for a full matrix of p=n; i.e. no error matrix), one can show that $$\overline{P} = \overline{U} \quad (4)$$

and $$\overline{T}^T\overline{T} = \overline{\Lambda} \quad (5)$$

A consequence of the above eigenanalysis is that each eigenvalue represents the variance of the data in the direction of the corresponding eigenvector within n-dimensional space. Hence, the largest eigenvalue corresponds to the greatest variance in the data within the n-dimensional space whereas the smallest eigenvalue represents the smallest variance in the data. By definition, all eigenvectors are orthogonal, and therefore, the second largest eigenvalue corresponds to the second greatest variance in the data in the direction of the corresponding eigenvector which is, of course, normal to the direction of the first eigenvector. In general, for such analysis, the first several (three to four, or more) largest eigenvalues are chosen to approximate the data and, as a result of the approximation, an error $\overline{E}$ is introduced to the representation in equation (1). In summary, once the set of eigenvalues and their corresponding eigenvectors are determined, a set of the largest eigenvalues can be chosen and the error matrix $\overline{E}$ of equation (1) can be determined.

An example of commercially available software which supports PCA modeling is SIMCA-P 8.0; for further details, see the User's Manual (*User Guide to SIMCA-P 8.0: A new standard in multivariate data analysis*, Umetrics AB, Version 8.0, September 1999). The contents of the manual are incorporated herein by reference. Using SIMCA-P 8.0, for example, one can determine the scores matrix $\overline{T}$ and the loadings matrix $\overline{P}$, as well as additional information regarding the ability of each component to describe each variable in $\overline{X}$ and the total variation of each variable in $\overline{X}$ by a component.

Additionally, SIMCA-P 8.0 is further capable of producing as output other statistical quantities such as the absolute distance to the model of an observation (DModX), or the Hotelling $T^2$ parameter for an observation, or the Q-statistics (e.g., $Q^2$ which represents the fraction of the total variation of the variable data, $X_i$, that can be predicted by a component). The distance to the model DModX can be calculated as follows $$s_i = \sqrt{\frac{\sum e_{ik}^2}{(K-A)}} * v, \quad (6)$$

where v is a correction factor, K is the number of variables, A is the number of model dimensions, and $e_{ik}$ represents the deviation between the original values and the projections for the $i^{th}$ observation (substrate run, instant in time, etc.) and the $k^{th}$ variable. For example, a PCA model (loadings matrix $\overline{P}$, etc.) can be constructed using a "training" set of data (i.e. assemble $\overline{X}$ for a number of observations and determine a PCA model using SIMCA-P). Once the PCA model is constructed, projections of a new observation onto the PCA model can be utilized to determine a residual matrix $\overline{E}$, as in equation (1).

Similarly, the Hotelling $T^2$ can be calculated as follows $$T_i^2 = \sum_{a=1}^{A} \frac{t_{ia}^2}{s_{ta}^2}, \quad (7)$$

where $t_{ia}$ is the score for the $i^{th}$ observation (substrate run, instant in time, etc.) and the $a^{th}$ model dimension. For example, a PCA model (loadings matrix $\overline{P}$, etc.) can be constructed using a "training" set of data (i.e. assemble $\overline{X}$ for a number of observations and determine a PCA model using SIMCA-P). Once the PCA model is constructed, projections of a new observation onto the PCA model can be utilized to determine a new scores matrix $\overline{T}$.

Typically, a statistical quantity, such as the distance to the model DModX or the Hotelling $T^2$, is monitored for a process, and, when this quantity exceeds a pre-determined control limit, a fault for the process is detected. However, a PCA model, constructed as described above, can suffer from several deficiencies. For example, those variables whose variations are important for the process and the product quality may not show sufficient sensitivity. Additionally, for example, the variables whose modeling variations are very small can be over-weighted simply by constructing the model automatically. Therefore, an embodiment of the present invention is to incorporate the application of a weighting factor to each variable and, thereby, adjust their relative importance. In doing so, at least one of the following can be achieved: (i) important variables can be emphasized; (ii) less important variables can be de-emphasized, while still maintaining their presence for detecting gross errors; (iii) false alarms can be reduced; (iv) true alarms can be identified more easily; and (v) model parameters can be tuned in order to be sensitive to certain faults.

The weighting factor (W) can, for example, be based on at least one of the following parameters: the modeling data standard deviation ($S_o$); the desired standard deviation of the variable ($S_d$); the relative importance of the variable (f); and the sensor resolution (R). The modeling data standard deviation can, for example, be the standard deviation of the "training set" of data for a particular variable as described above. The desired standard deviation can be, for example, the standard deviation pertaining to expected fluctuations of the particular variable. For example, assuming unit variance scaling, the weighting factor W can be expressed as $$W = \frac{S_o}{\max(S_d, R)} * f. \quad (8)$$

Figure 6:
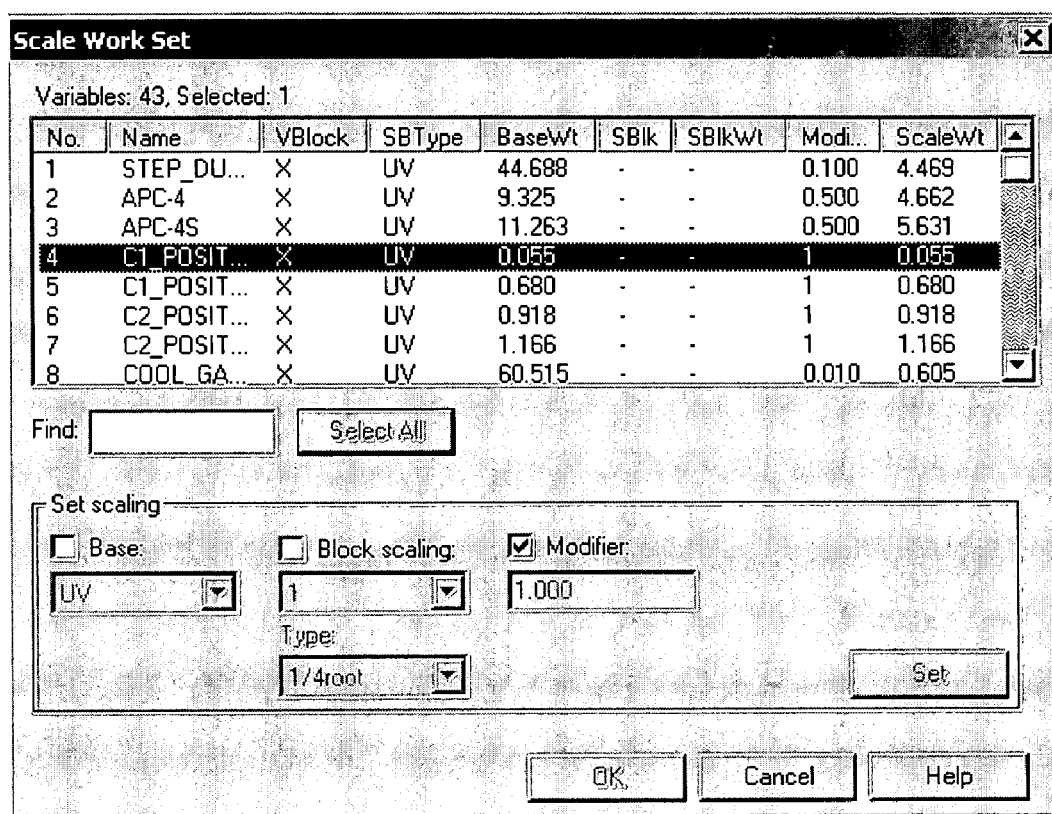
FIG. 6 presents a graphical user interface (GUI) for a principal components analysis (PCA) model.

Once a weighting factor for each variable is determined, the PCA model can be modified accordingly in order to include such a weighting. For example, as shown in FIG. 6, SIMCA-P offers a field in its graphical user interface (GUI) that can be used as a weighting factor (or "modifier").

Alternately, the weighting factors can be set for each variable utilizing a group scaling method. In an example, Table 1 presents an exemplary set of tool data, for a plasma processing system such as those described in FIGS. 2 through 5, including sixty-one tool data parameters. Therein, a weighting factor W=1 can be set for important variables such as C1 POSITION, C2 POSITION, RF VPP, LOWER TEMP, RF REFLECT, and RF VDC; a weighting factor W=0.5 can be set for less important variables such as APC; a weighting factor W=0.1 can be set for lesser important variables such as STEP, ESC VOLTAGE, ESC CURRENT, MAGNITUDE, PHASE, and PRESSURE; a weighting factor W=0.05 can be set for even lesser important variables such as RF FORWARD; and a weighting factor W=0.01 can be set for even lesser important variables such as HE E PRES, HE C PRES, HE E FLOW, and HE C FLOW.

Figure 7A:
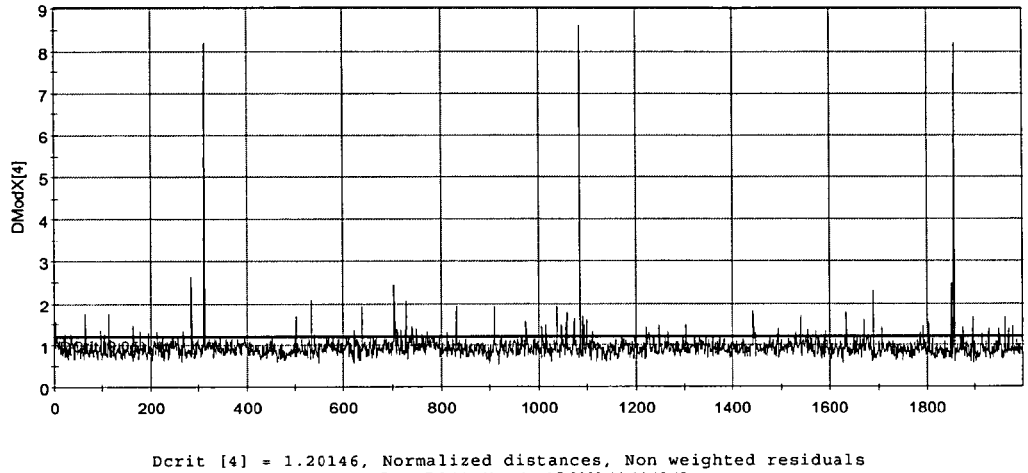
FIG. 7A presents a distance to model (DModX) statistical quantity as a function of substrate run for a regular PCA model.
Figure 7B:
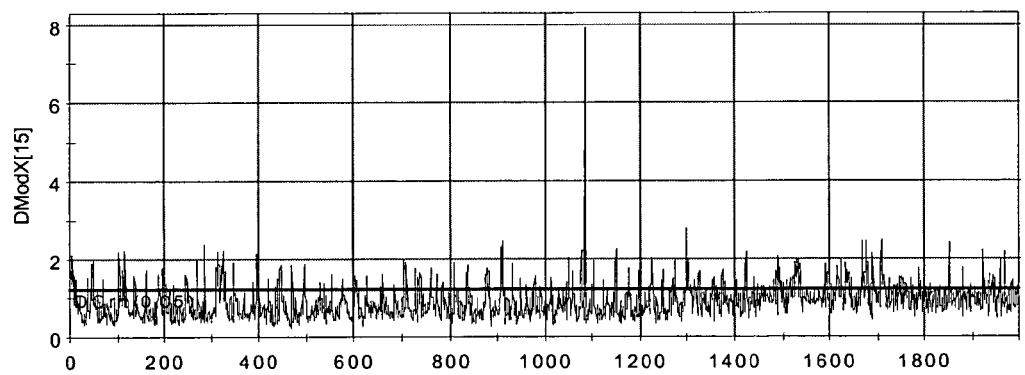
FIG. 7B presents a distance to model (DModX) statistical quantity as a function of substrate run for a weighted PCA model.
Figure 8:
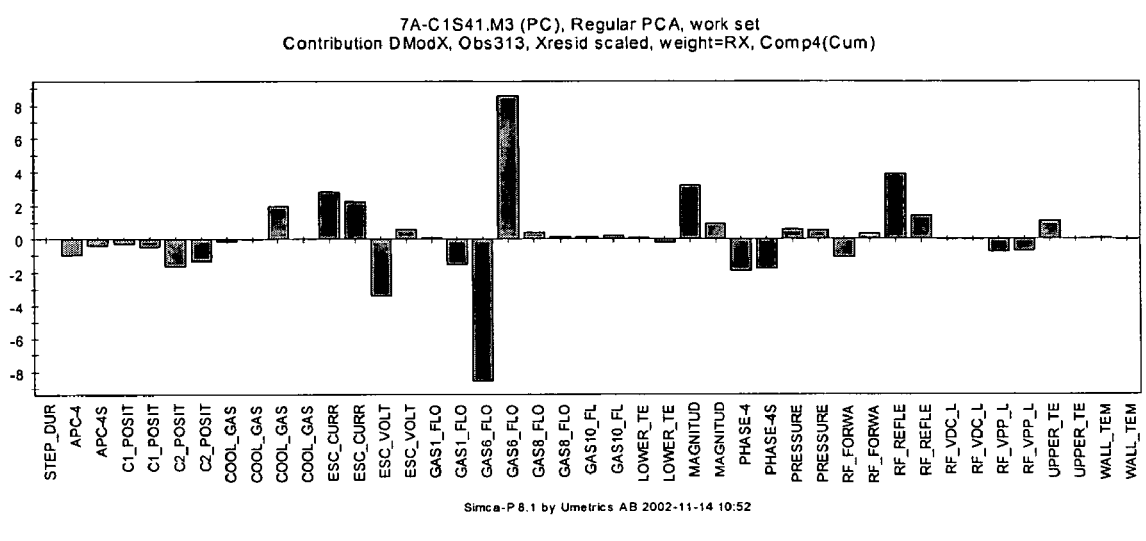
FIG. 8 presents a contributions plot for the weighted PCA model of FIG. 7B.

With continuing reference to this example, a contact oxide etch process is utilized to construct a PCA model. The etch process comprises a fixed time of 160 seconds, during which all trace parameters are recorded. Approximately two thousand (2000) substrates are run to construct the PCA model. Furthermore, two models are constructed including a standard PCA model (Regular PCA), and a weighted PCA model (WPCA). In both cases, the statistical quantity DModX is computed for each observation (or substrate run), and a value of five (5) is set for a control limit in order to ignore small deviations. FIG. 7A presents DModX for the regular PCA model, and FIG. 7B presents DModX for the weighted PCA model. By inspection of FIGS. 7A and 7B, the regular PCA model identifies three outliers (at approximately substrate runs 300, 1100, and 1850), and the weighted PCA model identifies only a single outlier (at approximately substrate run 1100). Upon review of the contribution plot, as shown in FIG. 8, the two different outliers arise due to GAS6 FLOW. However, the difference between "normal" and "abnormal" is only 0.00065, and, therefore, the regular PCA model is too sensitive to some of the less important variables.

TABLE 1

Exemplary tool data.

| PARAMETER | DESCRIPTION |
|---|---|
| APC | Adaptive pressure control valve setting |
| HE_C_PRESS | Helium backside pressure (center), Average |
| AR_FLOW | Argon gas flow rate, Average |
| PRESSURE | Chamber pressure, Average |
| UPPER_TEMP | UEL temperature, Average |
| VIP_Z | Current-voltage probe impedance, Average |
| HE_C_FLOW-S | Helium backside flow (center), Standard deviation |
| ESC_VOLTAGE-S | Electrostatic clamp voltage, Standard deviation |
| MAGNITUDE-S | Match network control signal, magnitude, Standard deviation |
| RF_VDC-S | DC voltage, RF system, Standard deviation |
| VIP_RF_ON-S | Current voltage probe on/off status, Standard deviation |

TABLE 1-continued

Exemplary tool data.

| PARAMETER | DESCRIPTION |
|---|---|
| C1_POSITION | Capacitor no. 1 position, Average |
| HE_E_PRES | Helium backside pressure (edge), Average |
| C5F8_FLOW | C5F8 gas flow rate, Average |
| RF_FORWARD | Forward RF power, Average |
| VIP_I | Current-voltage probe current, Average |
| WALL_TEMP | Chamber wall temperature, Average |
| HE_E_FLOW-S | Helium backside flow (edge), Standard deviation |
| O2_FLOW-S | Oxygen gas flow rate, Standard deviation |
| PHASE-S | Match network control signal, phase, Standard deviation |
| RF_VPP-S | RF voltage peak-to-peak, Standard deviation |
| VIP_V-S | Current-voltage probe voltage, Standard deviation |
| HE_E_FLOW | Helium backside flow (edge), Average |
| O2_FLOW | Oxygen gas flow rate, Average |
| PHASE | Match network control signal, phase, Average |
| RF_VPP | RF voltage peak-to-peak, Average |
| VIP_V | Current-voltage probe voltage, Average |
| C2_POSITION-S | Capacitor no. 2 position, Standard deviation |
| ESC_CURRENT-S | Electrostatic clamp current, Standard deviation |
| LOWER_TEMP-S | LEL temperature, Standard deviation |
| RF_REFLECT-S | Reflected RF power, Standard deviation |
| RF_FORWARD-S | Forward RF power, Standard deviation |
| C2_POSITION | Capacitor no. 2 position, Average |
| ESC_CURRENT | Electrostatic clamp current, Average |
| LOWER_TEMP | LEL temperature, Average |
| RF_REFLECT | Reflected RF power, Average |
| VIP_PHASE | Current-voltage probe phase, Average |
| APC-S | Adaptive pressure control valve setting, Standard deviation |
| HE_C_PRES-S | Helium backside pressure (center), Standard deviation |
| AR_FLOW-S | Argon gas flow rate, Standard deviation |
| PRESSURE-S | Chamber pressure, Standard deviation |
| UPPER_TEMP-S | UEL temperature, Standard deviation |
| VIP_Z-S | Current-voltage probe impedance, Standard deviation |
| HE_C_FLOW | Helium backside flow (center), Average |
| ESC_VOLTAGE | Electrostatic clamp voltage, Average |
| MAGNITUDE | Match network control signal, magnitude, Average |
| RF_VDC | DC voltage, RF system, Average |
| VIP_RF_ON | Current voltage probe on/off status, Average |
| C1_POSITION-S | Capacitor no. 1 position, Standard deviation |
| HE_E_PRES-S | Helium backside pressure (edge), Standard deviation |
| C5F8_FLOW-S | C5F8 gas flow rate, Standard deviation |
| VIP_I-S | Current-voltage probe current, Standard deviation |
| WALL_TEMP-S | Chamber wall temperature, Standard deviation |
| VIP_PHASE-S | Current-voltage probe phase, Standard deviation |
| RF_HR | RF hours |
| SLOT_ID | Wafer slot index |
| RF_HRxFR_THK | RF hours (X) Focus ring thickness |
| RF_HRxFR_RFHR | RF hours (X) Focus ring RF hours |
| FR_THK | Focus ring thickness |
| FR_RFHR | Focus ring RF hours |
| FR_THKxFR_RFHR | Focus ring thickness (X) Focus ring RF hours |
| STEP | Step duration |

In another example, a normal range for C1 POSITION is 670 to 730, and purposefully, for one substrate, C1 POSITION is changed to 550 (a gross error). In the regular PCA model, a very small change from a value of DModX=0.96 to 1.48 is recorded once the gross error was instituted. However, in the weighted PCA model, a substantive change from a value of DModX=2.03 to 8.49 is recorded once the gross error was instituted.

Figure 9:
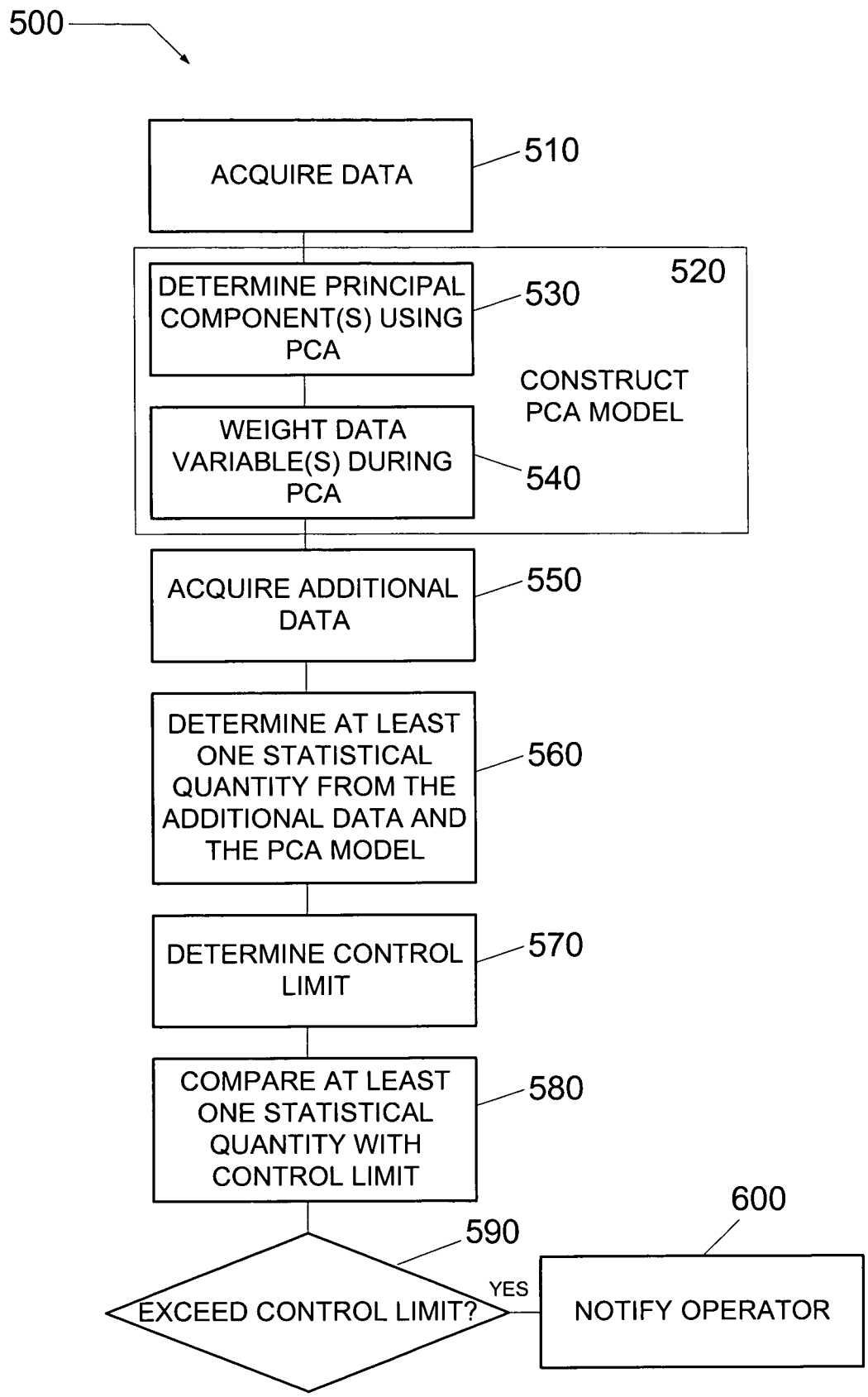
FIG. 9 presents a method of monitoring a processing system for processing a substrate during the course of semiconductor manufacturing according to an embodiment of the present invention.

FIG. 9 presents a flow chart describing a method of monitoring a processing system for processing a substrate during the course of semiconductor manufacturing. The method 500 begins at 510 with acquiring data from the processing system for a plurality of observations. The processing system can, for example, be an etch system, or it may be another processing system as described in FIG. 1. The data from the processing system can be acquired using a plurality of sensors coupled to the processing system and a controller. The data can, for example, comprise any one of the data variables presented in Table 1 for an etch system. Additional data can, for example, include optical emission spectra, RF harmonics of voltage and/or current measurements or radiated RF emission, etc. Each observation can pertain to a substrate run, instant in time, time average, etc.

At 520, a PCA model is constructed from the acquired data by determining one or more principal components to represent the data at 530 and weighting the data variables of the acquired data at 540. For example, a commercially available software such as SIMCA-P can be utilized to construct the PCA model. Additionally, the weighting of a data variable can utilize at least one of a data standard deviation, a desired standard deviation of the data variable, a relative importance of the data variable, and a data resolution of the data variable. Alternately, the weighting can utilize a group scaling method.

At 550, additional data is acquired from a processing system, and, at 560, at least one statistical quantity is determined from the additional data and the PCA model. For example, the additional data can be forward projected onto the one or more principal components to determine a set of scores, and the set of scores can be backward projected onto the principal components to determine one or more residual errors. Utilizing either the set of scores in conjunction with the model set of scores, or the one or more residual errors, at least one statistical quantity can be determined, such as a distance to the model (DModX) or a Hotelling $T^2$ parameter, for each additional observation.

At 570, a control limit can be set, and, at 580, at least one statistical quantity can be compared with the control limit. The control limit can be set using either subjective methods or empirical methods. For example, when using the distance to the model parameter DModX, the control limit can be set at a value of 5 (see, for instance, FIGS. 7A and 7B). Additionally, for example, when using the Hotelling $T^2$ parameter, the control limit can be set at a value of 100. Alternatively, for example, the control limit can be established by assuming a theoretical distribution for the statistical quantity, such as a $\chi^2$-distribution; however, the observed distribution should be verified with the theory. If the at least one statistical quantity exceeds the control limit, then a fault for the processing system is detected at 590, and an operator can be notified at 600.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of monitoring a processing system for processing a substrate during the course of semiconductor manufacturing comprising:
   acquiring data from said processing system for a plurality of observations, said data comprising a plurality of data variables;
   determining one or more principal components of said data for said plurality of observations using principal components analysis;
   applying a first weighting factor to a first one of said plurality of data variables and a second weighting factor to a second one of said plurality of data variables during said principal components analysis;
   acquiring additional data from said processing system;
   determining at least one statistical quantity from one or more scores calculated from a projection of said additional data onto said one or more principal components determined by using said first weighting factor and said second weighting factor;
   determining a control limit for said at least one statistical quantity; and
   comparing said at least one statistical quantity to said control limit,
   wherein the first weighting factor is based on a first relative importance of the first one of said plurality of data variables, the second weighting factor is based on a second relative importance of the second one of said plurality of data variables, and the first relative importance is different from the second relative importance.

2. The method as recited in claim 1, wherein a process fault has occurred when said at least one statistical quantity exceeds said control limit.

3. The method as recited in claim 1, wherein said data comprises at least one of a capacitor position, a forward radio frequency (RF) power, a reflected RF power, a voltage, a current, a phase, an impedance, a RF peak-to-peak voltage, a RF self-induced direct current bias, a chamber pressure, a gas flow rate, a temperature, a backside gas pressure, a backside gas flow rate, an electrostatic clamp voltage, an electrostatic clamp current, a focus ring thickness, RF hours, a process step duration, focus ring RF hours, an optical emission spectrum, and RF harmonics.

4. The method as recited in claim 1, wherein said data comprises at least one of an instantaneous value, a time average, a standard deviation, a third moment, a fourth moment, and a variance.

5. The method as recited in claim 1, wherein said statistical quantity comprises at least one of a distance to model parameter (DModX), and a Hotelling $T^2$ parameter.

6. The method as recited in claim 1, wherein said determining at least one statistical quantity further comprises a back-projection of said one or more scores with said one or more principal components to determine one or more residual errors.

7. The method as recited in claim 6, wherein said back-projection of said one or more scores with said one or more principal components comprises matrix multiplication.

8. The method as recited in claim 1, wherein said projection of said additional data onto said one or more principal components comprises matrix multiplication.

9. The method as recited in claim 1, wherein at least one of said first weighting factor and said second weighting factor is determined from at least one of a data standard deviation ($S_o$), a desired standard deviation of said data variable ($S_d$), and a data resolution (R).

10. The method as recited in claim 1, wherein said applying comprises applying a group scaling method.

11. The method as recited in claim 1, further comprising:
    accessing at least one of said data, said additional data, said at least one statistical quantity, and said control limit via at least one of an intranet, and an internet.

* * * * *